United States Patent
Hasegawa et al.

(10) Patent No.: US 12,145,876 B2
(45) Date of Patent: Nov. 19, 2024

(54) TRANSPARENT CONDUCTIVE FILM-ATTACHED GLASS SHEET, TRANSPARENT CONDUCTIVE FILM-ATTACHED GLASS ROLL, AND MANUFACTURING METHOD THEREFOR

(71) Applicants: NIPPON ELECTRIC GLASS CO., LTD., Otsu (JP); NATIONAL UNIVERSITY CORPORATION YAMAGATA UNIVERSITY, Yamagata (JP)

(72) Inventors: Yoshinori Hasegawa, Otsu (JP); Takayuki Noda, Otsu (JP); Tadahiro Furukawa, Yonezawa (JP)

(73) Assignees: NIPPON ELECTRIC GLASS CO., LTD., Shiga (JP); NATIONAL UNIVERSITY CORPORATION YAMAGATA UNIVERSITY, Yamagata (JP)

( * ) Notice: Subject to any disclaimer, the term of this patent is extended or adjusted under 35 U.S.C. 154(b) by 783 days.

(21) Appl. No.: 16/761,508

(22) PCT Filed: Nov. 6, 2018

(86) PCT No.: PCT/JP2018/041076
§ 371 (c)(1),
(2) Date: May 5, 2020

(87) PCT Pub. No.: WO2019/102836
PCT Pub. Date: May 31, 2019

(65) Prior Publication Data
US 2020/0283334 A1   Sep. 10, 2020

(30) Foreign Application Priority Data
Nov. 24, 2017   (JP) ................................ 2017-225828

(51) Int. Cl.
| | | |
|---|---|---|
| *C03C 17/245* | (2006.01) | |
| *C23C 14/08* | (2006.01) | |
| *C23C 14/34* | (2006.01) | |
| *C23C 14/58* | (2006.01) | |

(52) U.S. Cl.
CPC .......... *C03C 17/245* (2013.01); *C23C 14/086* (2013.01); *C23C 14/34* (2013.01); *C23C 14/5806* (2013.01); *C03C 2217/23* (2013.01); *C03C 2217/231* (2013.01); *C03C 2218/154* (2013.01); *C03C 2218/32* (2013.01)

(58) Field of Classification Search
None
See application file for complete search history.

(56) References Cited

U.S. PATENT DOCUMENTS

| | | |
|---|---|---|
| 2013/0105301 A1 | 5/2013 | Yamazaki et al. |
| 2013/0149555 A1 | 6/2013 | Yamazaki et al. |
| 2014/0154424 A1 | 6/2014 | Oh et al. |
| 2015/0357076 A1 | 12/2015 | Sasa et al. |
| 2015/0357077 A1 | 12/2015 | Sasa et al. |
| 2016/0024644 A1 | 1/2016 | Sasa et al. |
| 2016/0155531 A1 | 6/2016 | Kawakami et al. |
| 2016/0160345 A1 | 6/2016 | Miyamoto et al. |
| 2016/0300632 A1 | 10/2016 | Kawakami et al. |
| 2017/0038889 A1 | 2/2017 | Fujino et al. |
| 2017/0047144 A1 | 2/2017 | Kato et al. |
| 2017/0051398 A1 | 2/2017 | Fujino et al. |
| 2017/0232701 A1* | 8/2017 | Keite-Telgenbüscher ................... B32B 17/10 428/189 |
| 2019/0233939 A1 | 8/2019 | Miyamoto et al. |

FOREIGN PATENT DOCUMENTS

| | | | |
|---|---|---|---|
| CN | 102985585 A | 3/2013 | |
| CN | 104937676 A | 9/2015 | |
| CN | 105637111 A | 6/2016 | |
| JP | 62-202418 A | 9/1987 | |
| JP | 62-202419 A | 9/1987 | |
| JP | 2001-347220 A | 12/2001 | |
| JP | 2011-194907 A | 10/2011 | |
| JP | 2014-109073 A | 6/2014 | |
| JP | 2015-032183 A | 2/2015 | |
| JP | 2015-147687 A | 8/2015 | |
| TW | 201136845 A * | 11/2011 | ........... B32B 17/064 |

OTHER PUBLICATIONS

Teranishi et al., TW 201136845, Nov. 1, 2011 (machine translation) (Year: 2011).*
Official Communication issued in International Patent Application No. PCT/JP2018/041076, mailed on Feb. 12, 2019.

* cited by examiner

*Primary Examiner* — Cheng Yuan Huang
(74) *Attorney, Agent, or Firm* — Keating & Bennett, LLP

(57) ABSTRACT

Provided is a transparent conductive film-attached glass sheet that is less likely to be broken when produced or used in the form of a roll. A transparent conductive film-attached glass sheet 1 includes: a glass sheet 2; and an amorphous transparent conductive film 3 provided on a principal surface 2a of the glass sheet 2.

3 Claims, 4 Drawing Sheets

[FIG. 1]
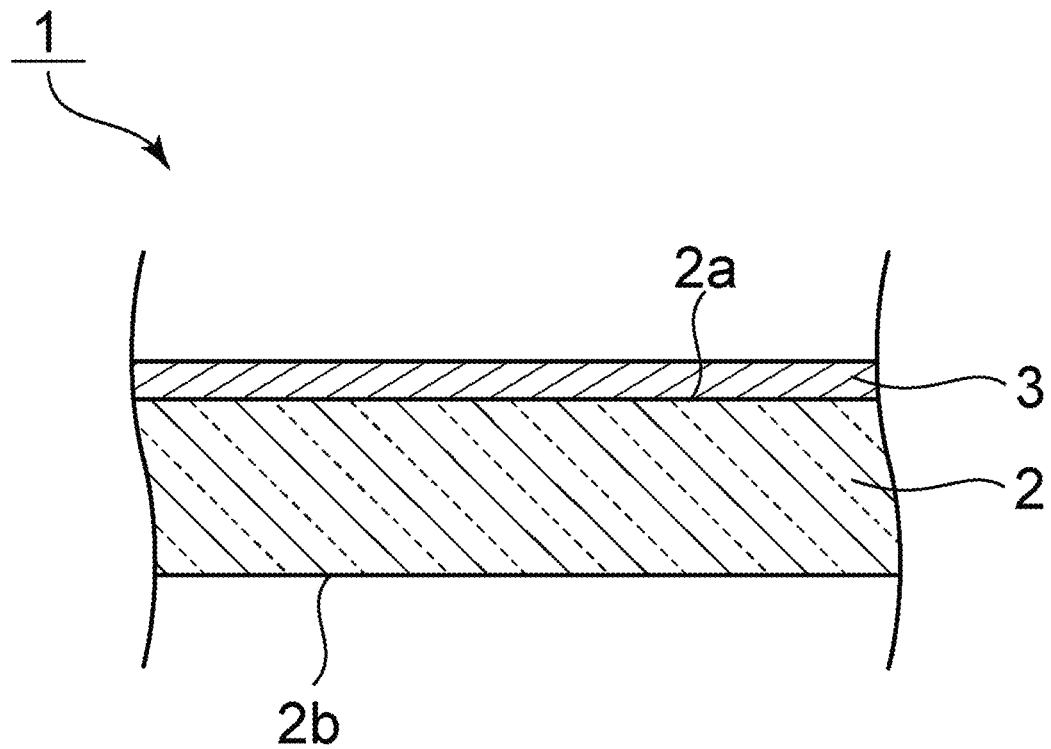
[FIG. 2]
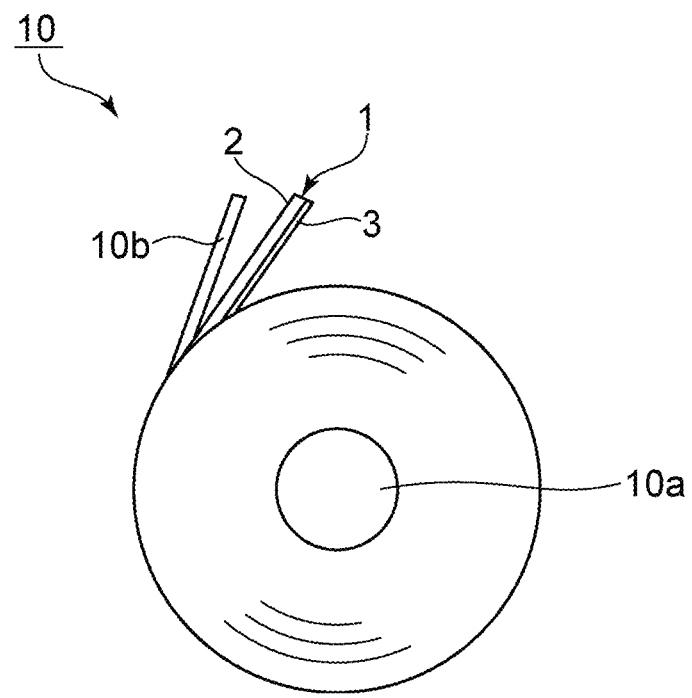

[FIG. 3]
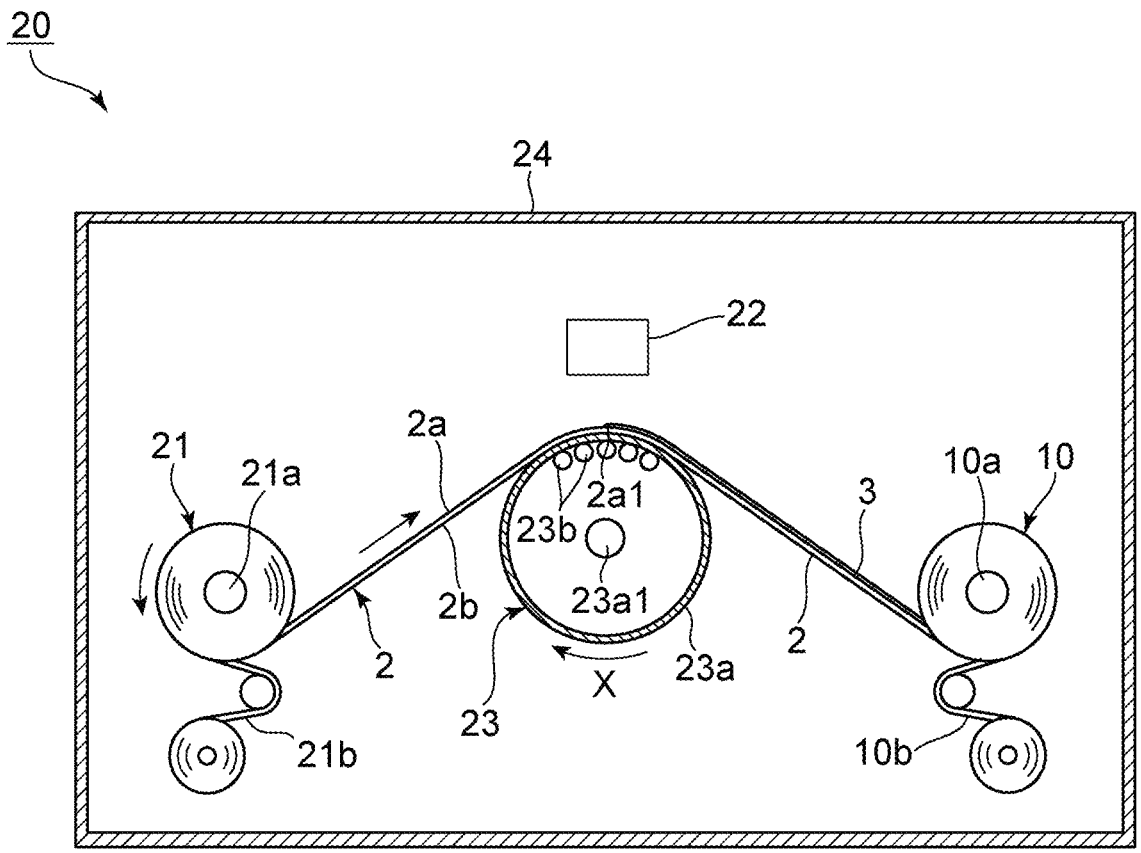
[FIG. 4]
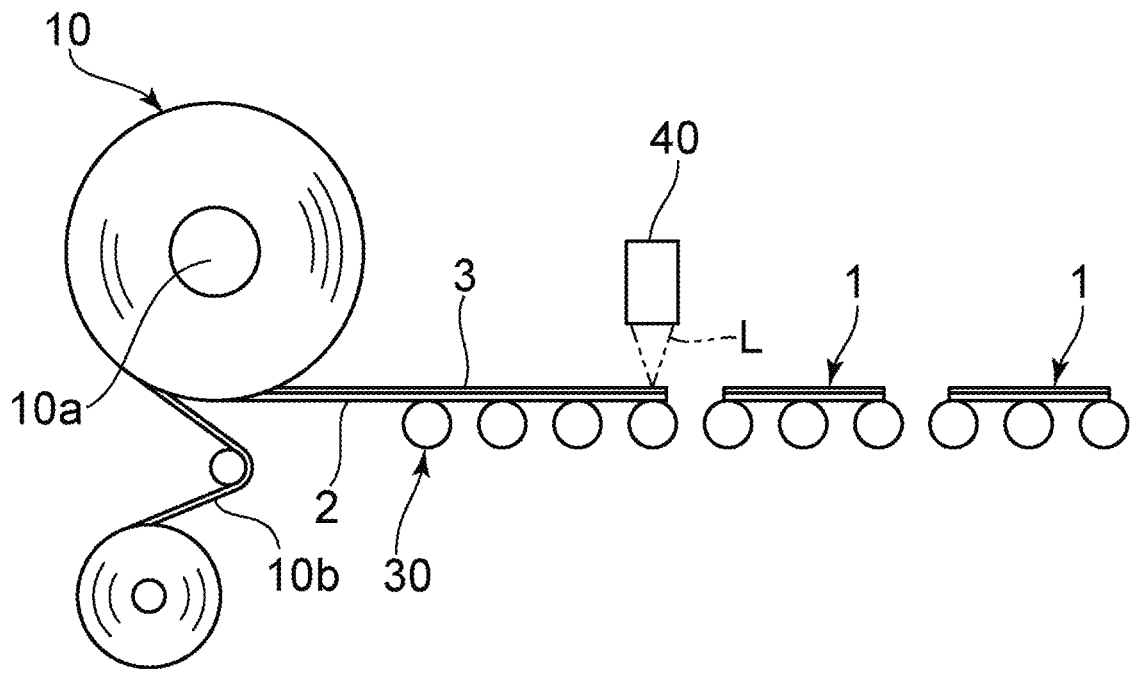

[FIG. 5]
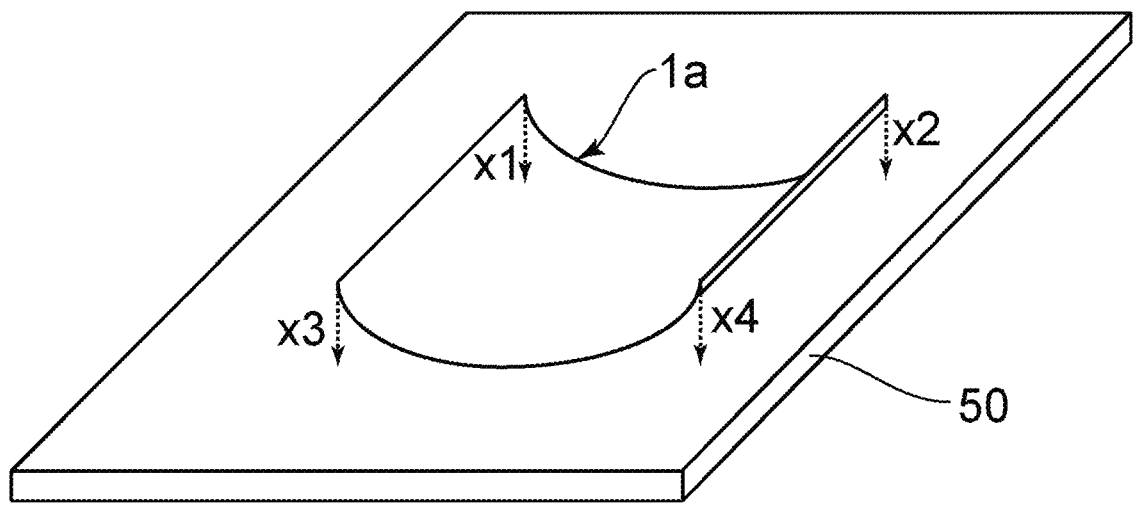
[FIG. 6]
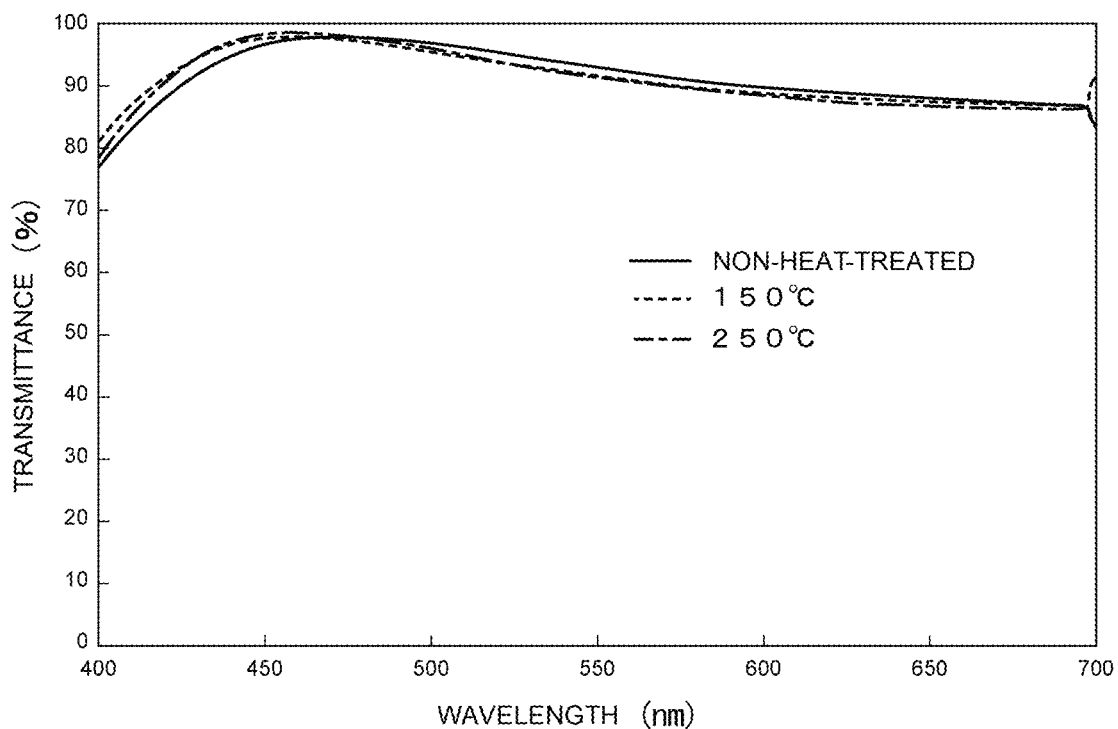

[FIG. 7]
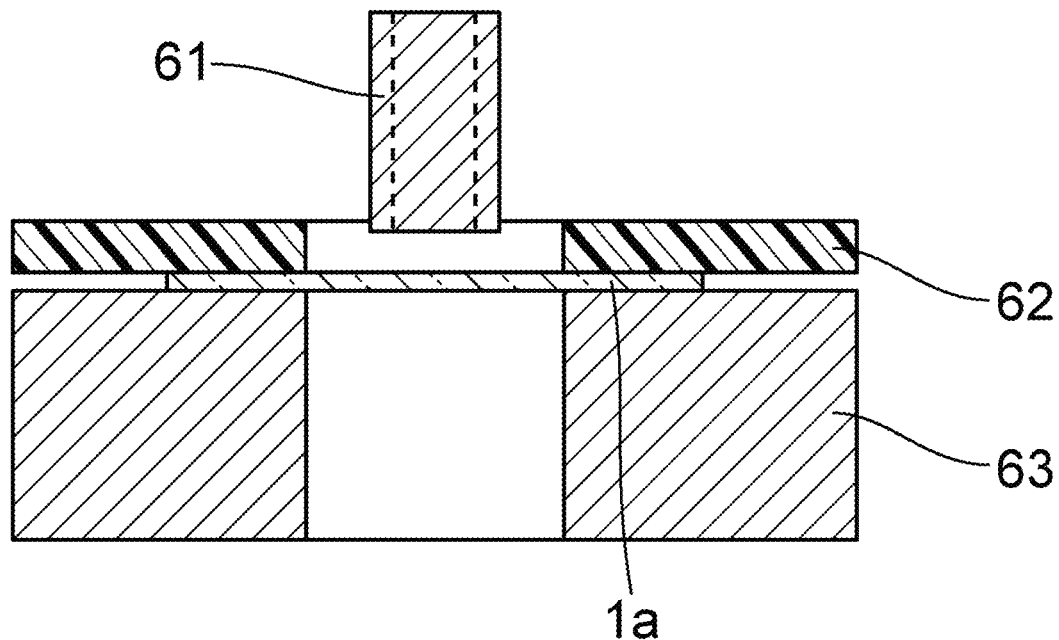
[FIG. 8]
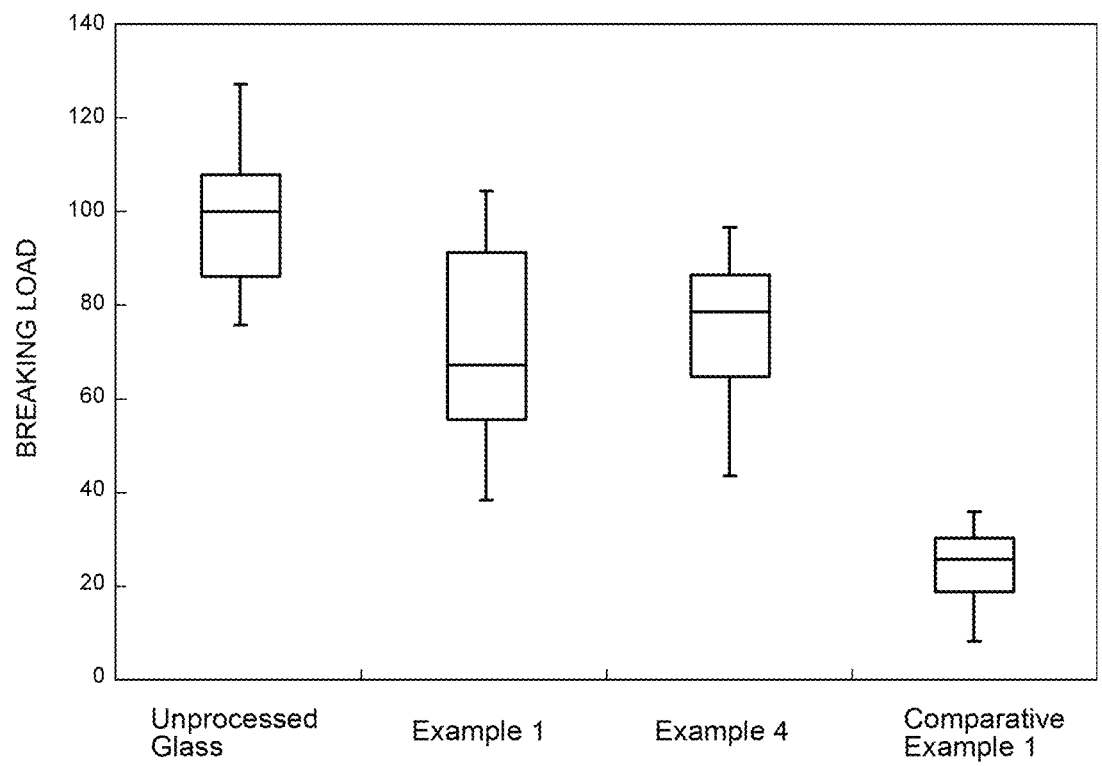

TRANSPARENT CONDUCTIVE FILM-ATTACHED GLASS SHEET, TRANSPARENT CONDUCTIVE FILM-ATTACHED GLASS ROLL, AND MANUFACTURING METHOD THEREFOR

TECHNICAL FIELD

The present invention relates to transparent conductive film-attached glass sheets, transparent conductive film-attached glass rolls, and respective methods for manufacturing the transparent conductive film-attached glass sheets and transparent conductive film-attached glass rolls.

BACKGROUND ART

Conventionally, for use in display devices, including liquid crystal display devices and organic EL display devices, organic EL lighting devices, solar cells, and so on, a film-attached glass substrate is used in which a transparent conductive film made of, for example, indium tin oxide (ITO), is provided on a glass substrate. As an example of a method for producing such a film-attached glass substrate, there is known a method of forming a transparent conductive film on a glass substrate using sputtering or other processes.

Patent Literature 1 below discloses a roll-to-roll sputtering process in which a flexible substrate drawn out from a wind-off roll is conveyed to a depositing portion and a film is formed on the flexible substrate in the depositing portion and then taken up by a take-up roll. Patent Literature 1 describes that a target substance, such as ITO, is sputtered at high temperatures onto the substrate and thus crystallized, so that a film having a low specific resistance and a high transmittance can be obtained.

CITATION LIST

Patent Literature

PTL 1
JP-A-2014-109073

SUMMARY OF INVENTION

Technical Problem

However, when, as in Patent Literature 1, a target substance, such as ITO, is formed into a film on a flexible substrate by sputtering, there arises a problem that, for example, upon occurrence of a bending stress in the flexible substrate, the conductive film or the flexible substrate is easily broken. Therefore, storage and handling of the flexible substrate having such a conductive film formed thereon involve a high risk of breakage. This tendency is pronounced particularly in the production or use of the flexible substrate in the form of a roll as in Patent Literature 1.

An object of the present invention is to provide a transparent conductive film-attached glass sheet, a transparent conductive film-attached glass roll, and respective methods for manufacturing the transparent conductive film-attached glass sheet and the transparent conductive film-attached glass roll in each of which the transparent conductive film-attached glass sheet is less likely to be broken when produced or used in the form of a roll.

Solution to Problem

A transparent conductive film-attached glass sheet according to the present invention includes a glass sheet and an amorphous transparent conductive film provided on a principal surface of the glass sheet.

In the transparent conductive film-attached glass sheet according to the present invention, the transparent conductive film is preferably made of indium tin oxide.

In the transparent conductive film-attached glass sheet according to the present invention, the transparent conductive film is preferably made of indium zinc oxide.

In the transparent conductive film-attached glass sheet according to the present invention, the transparent conductive film preferably has a thickness of not less than 30 nm and not more than 500 nm.

In the transparent conductive film-attached glass sheet according to the present invention, the glass sheet preferably has a thickness of not less than 10 μm and not more than 200 μm.

A transparent conductive film-attached glass roll according to the present invention is formed of the transparent conductive film-attached glass sheet according to the present invention being taken up.

A method for manufacturing a transparent conductive film-attached glass roll according to the present invention includes the steps of: drawing out a glass sheet from a glass roll; forming a transparent conductive film on a principal surface of the drawn glass sheet; and taking up the glass sheet having the transparent conductive film formed thereon, wherein, during formation of the transparent conductive film, a film forming portion of the glass sheet on which the transparent conductive film is to be formed is held at a temperature of not lower than −30° C. and not higher than 30° C.

In the method for manufacturing a transparent conductive film-attached glass roll according to the present invention, processing for forming the transparent conductive film is preferably performed by sputtering.

In the method for manufacturing a transparent conductive film-attached glass roll according to the present invention, processing for forming the transparent conductive film is preferably performed at least once.

A method for manufacturing a transparent conductive film-attached glass sheet according to the present invention includes the steps of: drawing out the glass sheet with the transparent conductive film formed thereon from the transparent conductive film-attached glass roll obtained by the method for manufacturing a transparent conductive film-attached glass roll according to the present invention and cutting the glass sheet to a predetermined size; and crystallizing the transparent conductive film on the cut glass sheet.

Advantageous Effects of Invention

The present invention enables provision of a transparent conductive film-attached glass sheet that is less likely to be broken when produced or used in the form of a roll.

BRIEF DESCRIPTION OF DRAWINGS

FIG. 1 is a schematic cross-sectional view showing a transparent conductive film-attached glass sheet according to an embodiment of the present invention.

FIG. 2 is a schematic view showing a transparent conductive film-attached glass roll according to an embodiment of the present invention.

FIG. 3 is a schematic view for illustrating a method for manufacturing a transparent conductive film-attached glass roll according to an embodiment of the present invention.

FIG. 4 is a schematic view for illustrating a method for manufacturing a transparent conductive film-attached glass sheet according to an embodiment of the present invention.

FIG. 5 is a schematic view for illustrating a method for evaluating warpage.

FIG. 6 is a graph showing spectral transmittance curves in Example 7.

FIG. 7 is a schematic cross-sectional view for illustrating a method of performing a ring-on-clamped ring test.

FIG. 8 is a graph showing results of the ring-on-clamped ring test.

DESCRIPTION OF EMBODIMENTS

Hereinafter, a description will be given of preferred embodiments. However, the following embodiments are merely illustrative and the present invention is not limited to the following embodiments. Throughout the drawings, members having substantially the same functions may be referred to by the same reference characters.

Transparent Conductive Film-Attached Glass Sheet

FIG. 1 is a schematic cross-sectional view showing a transparent conductive film-attached glass sheet according to an embodiment of the present invention. As shown in FIG. 1, the transparent conductive film-attached glass sheet 1 includes a glass sheet 2 and a transparent conductive film 3. The glass sheet 2 has a first principal surface 2a and a second principal surface 2b opposed to each other. The transparent conductive film 3 is provided on the first principal surface 2a of the glass sheet 2. The transparent conductive film 3 is amorphous. In the present invention, the amorphous transparent conductive film 3 refers to a film having a structure in which atoms having no crystal structure are randomly arranged, wherein substantially no peak is observed in its X-ray diffraction profile.

The shape of the glass sheet 2 is not particularly limited and an example is a rectangular sheet-like shape. The material for the glass sheet 2 is not particularly limited and examples that can be used include silicate glass, silica glass, borosilicate glass, soda-lime glass, aluminosilicate glass, chemically tempered glass, and alkali-free glass. Preferably, borosilicate glass, soda-lime glass, aluminosilicate glass, chemically tempered glass or alkali-free glass can be used as a material for the glass sheet 2. More preferably, alkali-free glass can be used as a material for the glass sheet 2. When alkali-free glass is used as a material for the glass sheet 2, a more chemically stable glass can be obtained. Alkali-free glass refers to glass substantially free of alkali component (alkali metal oxide). Specifically, alkali-free glass is glass in which the weight ratio of alkali component is 3000 ppm or less. The weight ratio of alkali component is preferably 1000 ppm or less, more preferably 500 ppm or less, and still more preferably 300 ppm or less.

The glass sheet 2 can be obtained by forming, for example, by any of conventionally known processes, including a float process, a roll-out process, a slot down-draw process, and a redraw process. Particularly, an overflow downdraw process is preferred for the forming.

The thickness of the glass sheet 2 is not particularly limited, but preferably not less than 10 μm, more preferably not less than 30 μm, preferably not more than 200 μm, and more preferably not more than 150 μm. When the thickness of the glass sheet 2 is within the above range, the glass sheet 2 can be more easily taken up and more easily formed into a glass roll (a roll of the glass sheet 2). Furthermore, the glass sheet 2 can be suitably used as a substrate for a thin electronic device.

There is no particular limitation as to the material for the transparent conductive film 3 so long as it has light transmittancy and electrical conductivity. The transparent conductive film 3 can be made of, for example, indium tin oxide (ITO), fluorine-doped tin oxide (FTO), indium zinc oxide (IZO) or aluminum-doped zinc oxide (AZO).

The thickness of the transparent conductive film 3 is not particularly limited, but preferably not less than 30 nm, more preferably not less than 50 nm, preferably not more than 500 nm, more preferably not more than 300 nm, and still more preferably not more than 200 nm. When the thickness of the transparent conductive film 3 is the above-described lower limit or more, cracks in the transparent conductive film 3 are even less likely to occur, so that a deterioration in electrical conductivity due to cracks is even less likely to occur. When the thickness of the transparent conductive film 3 is the above-described upper limit or less, the transparent conductive film-attached glass sheet 1 can be more easily taken up and more easily formed into a transparent conductive film-attached glass roll (a roll of the transparent conductive film-attached glass sheet 1).

When the transparent conductive film 3 is made of indium zinc oxide (IZO), the thickness of the transparent conductive film 3 is preferably not less than 50 nm, more preferably not less than 70 nm, preferably not more than 500 nm, and more preferably not more than 400 nm. In this case, indium zinc oxide (IZO) is not crystallized, but the transparent conductive film 3 has good transparency.

When the transparent conductive film 3 is indium tin oxide (ITO), it is preferably used in crystallized form. When indium tin oxide (ITO) is used in crystallized form, the transparent conductive film 3 can be further increased in electrical conductivity and transparency. Normally, indium tin oxide (ITO) can be crystallized by heat treatment at approximately 170° C. or higher.

The sheet resistance of the transparent conductive film 3 is preferably 30 ohms per square or less, and more preferably 15 ohms per square or less. In this case, the electrical conductivity of the transparent conductive film 3 can be further increased.

The transparent conductive film-attached glass sheet 1 has excellent light transmittancy and electrical conductivity and can therefore be suitably used for display devices, including liquid crystal display devices and organic EL display devices, organic EL lighting devices, solar cells, and so on.

FIG. 2 is a schematic view showing a transparent conductive film-attached glass roll according to an embodiment of the present invention. As shown in FIG. 2, the transparent conductive film-attached glass roll 10 is a roll of a transparent conductive film-attached glass sheet 1 formed so that the transparent conductive film-attached glass sheet 1 is taken up, preferably together with a protective film 10b, around a roll core 10a. In this manner, the transparent conductive film-attached glass sheet 1 may be used in the form of a transparent conductive film-attached glass roll 10. The material for the protective film 10b is not particularly limited and, for example, resin, such as polyethylene terephthalate (PET), can be used.

Since the transparent conductive film-attached glass sheet 1 includes the amorphous transparent conductive film 3, it is less likely to be broken even when produced or used in the form of a transparent conductive film-attached glass roll 10. In this regard, a detailed description will be given in the following section of a manufacturing method.

Method for Manufacturing Transparent Conductive Film-Attached Glass Roll

Hereinafter, a description will be given of an example of a method for manufacturing the transparent conductive film-attached glass roll 10 with reference to FIG. 3.

FIG. 3 is a schematic view for illustrating a method for manufacturing a transparent conductive film-attached glass roll according to an embodiment of the present invention. In the manufacturing method according to this embodiment, a film forming apparatus 20 shown in FIG. 3 can be used. The film forming apparatus 20 includes a glass roll 21, a sputtering source 22, a cooling roller 23, a transparent conductive film-attached glass roll 10, and a vacuum chamber 24. The glass roll 21, the sputtering source 22, the cooling roller 23, and the transparent conductive film-attached glass roll 10 are provided in the interior of the vacuum chamber 24. The interior of the vacuum chamber 24 is set at a predetermined degree of vacuum by an unshown vacuum pump and receives a supply of inert gas, such as argon gas, and a small amount of oxygen.

In the manufacturing method according to this embodiment, first, a glass roll 21 shown in FIG. 3 is prepared. The glass roll 21 is a roll of a glass sheet 2 in which a band of the glass sheet 2 is taken up around a roll core 21a. The glass sheet 2 forming the glass roll 21 is overlaid with a protective film 21b. The material for the protective film 21b is not particularly limited and, for example, resin, such as PET, can be used.

Next, the glass sheet 2 is drawn out from the prepared glass roll 21 and conveyed to the cooling roller 23 while the protective film 21b is peeled off from the glass sheet 2. Then, sputtering particles, for example, ITO particles, are scattered from the sputtering source 22 to deposit on the first principal surface 2a of the glass sheet 2. Thus, a transparent conductive film 3 can be formed on the first principal surface 2a of the glass sheet 2.

The sputtering source 22 is disposed a predetermined distance apart from the cooling roller 23 so that the sputtering particles (ITO particles) scattering from a target deposit on the first principal surface 2a of the glass sheet 2. The cooling roller 23 includes: a cylindrical roller body 23a supporting the glass sheet 2; and an unshown temperature controller main body capable of cooling the roller body 23a. The roller body 23a can be made of, for example, metal or ceramic. The roller body 23a is rotatably supported by a shaft 23a1. The temperature controller main body is disposed outside of the film forming apparatus 20 and, for the purpose of cooling the roller body 23a, a pipe line 23b for circulating a heat medium therethrough is disposed inside of the roller body 23a. The temperature of the roller body 23a is controlled by the circulation of the heat medium from the temperature controller main body.

When the shaft 23a1 is driven by an unshown drive source, the roller body 23a of the cooling roller 23 rotates in a predetermined direction (the direction indicated by the arrow X in FIG. 3) along the direction of conveyance of the glass sheet 2. A portion of the roller body 23a is in contact with the second principal surface 2b of the glass sheet 2. The roller body 23a conveys, by its rotation, the glass sheet 2 downstream.

In this embodiment, the temperature of a film forming portion 2a1 of the glass sheet 2 is held between −30° C. and 30° C., both inclusive, by the cooling roller 23. The film forming portion 2a1 is a portion of the first principal surface 2a of the glass sheet 2 where the transparent conductive film 3 is to be formed. In the manufacturing method according to this embodiment, it is sufficient if the temperature of at least the film forming portion 2a1 is held within the above range, and the portion of the first principal surface 2a other than the film forming portion 2a1 may also be held within the above range.

Next, the glass sheet 2 with the transparent conductive film 3 formed thereon is taken up around the roll core 10a, thus obtaining a transparent conductive film-attached glass roll 10. In taking up the glass sheet 2 with the transparent conductive film 3 formed thereon, it is taken up while being overlaid with the protective film 10b. Subsequently, the transparent conductive film-attached glass roll 10 is taken out from the vacuum chamber 24. For example, resin, such as PET, can be used as the protective film 10b.

FIG. 4 is a schematic view for illustrating a method for manufacturing a transparent conductive film-attached glass sheet according to an embodiment of the present invention.

As shown in FIG. 4, the glass sheet 2 with the transparent conductive film 3 formed thereon is drawn out from the obtained transparent conductive film-attached glass roll 10, and then cut into pieces. In drawing out the glass sheet 2 with the transparent conductive film 3 formed thereon, the protective film 10b is concurrently separated from the glass sheet 2. Then, the drawn glass sheet 2 is cut into flat sheets by a cutter 40 while being conveyed by a conveyer 30. Thus, transparent conductive film-attached glass sheets 1 can be obtained. For example, a roller conveyer is used as the conveyer 30. An example of the cutter 40 that can be used is, as shown in FIG. 4, a device capable of fusion cutting or cutting by irradiation with laser light L. A scribing cutter or other cutting tools may be used alternatively and the cutting method is not particularly limited.

In the manufacturing method according to this embodiment, as described above, the transparent conductive film 3 is formed while the temperature of the film forming portion 2a1 of the glass sheet 2 is held between −30° C. and 30° C., both inclusive. Therefore, the film forming temperature of the transparent conductive film 3 can be kept low, so that an amorphous transparent conductive film 3 can be obtained. Hence, the transparent conductive film-attached glass sheet 1 obtained by the manufacturing method according to this embodiment is less likely to be broken even when produced or used in the form of a roll, like the transparent conductive film-attached glass roll 10. The reasons for this will be described below as compared with a conventional transparent conductive film-attached glass sheet.

In a conventional manufacturing method, a crystalline transparent conductive film is obtained by forming a transparent conductive film at high temperatures by sputtering or other processes. In the conventional manufacturing method, by performing processing for film formation at high temperatures accompanied by crystallization as just described, a film having a low specific resistance and a high transmittance is obtained.

However, if the processing for film formation is performed at high temperatures accompanied by crystallization as described above, the contraction of the film due to crystallization often causes the production of film stress and formation of grain boundary in the film surface. Grain boundary is responsible for a current leakage and a short fault in an OLED device. If such film stress or grain boundary exists, breakage easily occurs by warpage of a glass sheet forming a base body, owing to bending stress applied to the glass sheet during handling. Particularly, when, as shown in FIG. 3, a glass sheet is handled in a roll-to-roll manner in which a transparent conductive film is formed on a glass sheet drawn out from a glass roll to obtain a transparent conductive film-attached glass roll, the glass sheet undergoes bending stress and thus warps, which involves a high degree of risk of breakage.

In contrast, in the manufacturing method according to this embodiment, an amorphous transparent conductive film 3 is formed by film formation at low temperatures, so that the transparent conductive film 3 is not crystallized. Therefore, the production of film stress is reduced and grain boundary is not clear. Hence, the glass sheet is less likely to cause a breakage due to the film when produced or used in the roll-to-roll manner.

Furthermore, since in this embodiment the film formation is performed while the temperature of the film forming portion 2a1 of the glass sheet 2 is held at low temperatures between −30° C. and 30° C., both inclusive, the warpage can be largely reduced. Considering a temperature rise due to deposition of sputtering particles scattered by the application of heat, the temperature of the film forming portion 2a1 is preferably held, in view of further reducing the warpage, between −30° C. and 0° C., both inclusive. Particularly when the transparent conductive film 3 is made of indium tin oxide (ITO), the above range is preferred because crystallization during film formation is even less likely to occur and film contraction is therefore even less likely to occur.

As thus far described, the transparent conductive film-attached glass sheet 1 obtained by the manufacturing method according to this embodiment is less likely to cause breakage and warpage even when produced or used in the form of a roll and therefore has excellent handleability.

The processing for forming the transparent conductive film 3 may be performed only once or may be performed a plurality of times. When the processing for film formation is performed only once, the manufacturing process can be further simplified. When the processing for film formation is performed a plurality of times to reduce the thickness of the film to be formed at one time, the stress loading on the surface of the glass sheet 2 due to film formation can be further reduced, so that warpage is even less likely to occur.

The method for forming the transparent conductive film 3 is not limited to sputtering. The transparent conductive film 3 may be formed, for example, by a vapor deposition process or a CVD process.

The obtained flat-sheet-shaped transparent conductive film-attached glass sheet 1 may be used in crystallized form if the bending stress or the like applied during post-process is small. Particularly when the transparent conductive film 3 is made of ITO, it is preferably used in crystallized form in view of further reducing the resistance value. The method for crystallizing the transparent conductive film 3 is not particularly limited and an example is a heat treatment. In this case, the temperature of the heat treatment may be, for example, 200° C. to 250° C. The time of the heat treatment varies considerably depending on the heat treatment method, but, for example, it may be 0.5 minutes to 30 minutes.

EXAMPLES

Hereinafter, a description will be given in further detail of the present invention with reference to specific examples. The present invention is not at all limited by the following examples and can be embodied in appropriately modified forms without changing the gist of the invention.

Example 1

Using the film forming apparatus 20 shown in FIG. 3, a transparent conductive film 3 was formed on a glass sheet 2. Specifically, the glass sheet 2 (alkali-free glass "OA-10G", manufactured by Nippon Electric Glass Co., Ltd., 100 μm thick) drawn out from the glass roll 21 underwent sputtering under the following conditions to form a transparent conductive film 3 thereon, thus obtaining a transparent conductive film-attached glass roll 10. The obtained transparent conductive film-attached glass roll 10 was cut into flat sheets by laser light L as shown in FIG. 4, resulting in transparent conductive film-attached glass sheets 1.

Film Forming Conditions of Transparent Conductive Film 3

Film material: ITO
Film forming temperature (temperature of film forming portion 2a1): −20° C.
Applied voltage during film formation: 3 kW
Rate of film formation: 0.3 m/min
Number of times of processing for film formation: once The thickness of the obtained transparent conductive film 3 was 100 nm and the sheet resistance thereof was 30 ohms per square. Regarding the evaluation for warpage, a 0.6 mm uplift was observed in a 100 mm square sheet. As seen from the above, in Example 1, it was confirmed that the warpage could be reduced to below 1 mm without decreasing the surface strength and breakage during handling was less likely to occur.

Furthermore, the obtained transparent conductive film-attached sheet 1 was subjected to crystallization processing at 250° C. for 30 minutes in a clean oven, so that the sheet resistance value could be reduced to 15 ohms per square. A resistivity meter (Loresta manufactured by Mitsubishi Chemical Analytech Co., Ltd.) was used for the measurement of the sheet resistance.

In the evaluation for warpage, measurement was conducted in conformity with SEMI D074-0116 (Guide for Measuring Dimensions for Plastic Films/Substrates). Specifically, as shown in FIG. 5, a 100 mm square (100 mm×100 mm) transparent conductive film-attached glass sheet sample 1a was cut out and put on a flat plate 50. Then, the respective distances x1 to x4 from the four ends of the transparent conductive film-attached glass sheet sample 1a to the flat plate 50 were measured and their average value ((x1+x2+x3+x4)/4) was defined as an amount of warpage.

Example 2

Transparent conductive film-attached glass sheets 1 were obtained in the same manner as in Example 1 except that the film forming conditions of the transparent conductive film 3 were changed as described below.

Film Forming Conditions of Transparent Conductive Film 3

Film material: ITO
Film forming temperature (temperature of film forming portion 2a1): −20° C.
Applied voltage during film formation: 3 kW
Rate of film formation: 1 m/min
Number of times of processing for film formation: three times The thickness of the obtained transparent conductive film 3 was 100 nm and the sheet resistance thereof was 30 ohms per square. Regarding the evaluation for warpage, substantially no uplift was produced in a 100 mm square sheet and the warpage could be reduced to below 1 mm. In Example 2, the thickness of a film obtained each time of processing for film formation was approximately one-third of that in Example 1 and three times of processing for film formation were taken to achieve a necessary sheet resistance value (film thickness). It was confirmed that, by performing the film formation in batches, the stress on the surface of the glass sheet 2 could be reduced and the occurrence of warpage could be further reduced, so that breakage during handling became less likely to occur.

Example 3

Transparent conductive film-attached glass sheets 1 were obtained in the same manner as in Example 1 except that the film forming conditions of the transparent conductive film 3 were changed as described below.

Film Forming Conditions of Transparent Conductive Film 3

Film material: ITO
Film forming temperature (temperature of film forming portion 2a1): −20° C.
Applied voltage during film formation: 1 kW
Rate of film formation: 0.1 m/min
Number of times of processing for film formation: once
The thickness of the obtained transparent conductive film 3 was 125 nm and the sheet resistance thereof was 30 ohms per square. Regarding the evaluation for warpage, substantially no uplift was produced in a 100 mm square sheet and the warpage could be reduced to below 1 mm. In Example 3, instead of setting the applied voltage to one-third of that in Example 1, the rate of film formation was set to one-third of that in Example 1 to achieve the sheet resistance value (film thickness). In Example 3, it was confirmed that the stress on the surface of the glass sheet 2 could be reduced and the occurrence of warpage was not found and could be further reduced, so that breakage during handling became less likely to occur.

Example 4

Transparent conductive film-attached glass sheets 1 were obtained in the same manner as in Example 1 except that the thickness of the glass sheet 2 was 50 μm (alkali-free glass "OA-10G" manufactured by Nippon Electric Glass, Co., Ltd.) and the film forming conditions of the transparent conductive film 3 were changed as described below.

Film Forming Conditions of Transparent Conductive Film 3

Film material: IZO
Film forming temperature (temperature of film forming portion 2a1): −20° C.
Applied voltage during film formation: 1 kW
Rate of film formation: 0.1 m/min
Number of times of processing for film formation: once
The thickness of the obtained transparent conductive film 3 was 100 nm and the sheet resistance thereof was 30 ohms per square. Regarding the evaluation for warpage, substantially no uplift was produced in a 100 mm square sheet and the warpage could be reduced to below 1 mm. In Example 4, it was confirmed that the warpage could be further reduced without decreasing the surface strength and breakage during handling was less likely to occur.

Example 5

Transparent conductive film-attached glass sheets 1 were obtained in the same manner as in Example 1 except that the thickness of the glass sheet 2 was 50 μm (alkali-free glass "OA-10G" manufactured by Nippon Electric Glass, Co., Ltd.) and the film forming conditions of the transparent conductive film 3 were changed as described below.

Film Forming Conditions of Transparent Conductive Film 3

Film material: IZO
Film forming temperature (temperature of film forming portion 2a1): 20° C. (normal temperature)
Applied voltage during film formation: 1 kW
Rate of film formation: 0.1 m/min
Number of times of processing for film formation: once
The thickness of the obtained transparent conductive film 3 was 100 nm and the sheet resistance thereof was 30 ohms per square. Regarding the evaluation for warpage, substantially no uplift was produced in a 100 mm square sheet and the warpage could be reduced to below 1 mm. As seen from the above, the warpage could be reduced without decreasing the surface strength. Even though, unlike the film formation at a low temperature in Example 4, the film formation was performed at 20° C. near to room temperature, there was no difference between their sheet resistance values. Furthermore, it was confirmed that no warpage occurred and breakage during handling was less likely to occur.

Example 6

Transparent conductive film-attached glass sheets 1 were obtained in the same manner as in Example 1 except that the thickness of the glass sheet 2 was 50 μm (alkali-free glass "OA-10G" manufactured by Nippon Electric Glass, Co., Ltd.) and the film forming conditions of the transparent conductive film 3 were changed as described below.

Film Forming Conditions of Transparent Conductive Film 3

Film material: IZO
Film forming temperature (temperature of film forming portion 2a1): −20° C.
Applied voltage during film formation: 1 kW
Rate of film formation: 0.13 m/min
Number of times of processing for film formation: three times
The thickness of the obtained transparent conductive film 3 was 250 nm and the sheet resistance thereof was 15 ohms per square. Regarding the evaluation for warpage, substantially no uplift was produced in a 100 mm square sheet and the warpage could be reduced to below 1 mm. As seen from the above, it was confirmed that the warpage could be reduced without decreasing the surface strength and breakage during handling was less likely to occur.

Furthermore, when the glass sheet 2 was subjected to three times of processing for film formation under the film forming conditions in Example 4, the film thickness was 250 nm and the sheet resistance was 15 ohms per square. This sheet resistance value was equal to that of the ITO film after having been crystallized.

Example 7

Transparent conductive film-attached glass sheets 1 were obtained in the same manner as in Example 1 except that the thickness of the glass sheet 2 was 50 μm (alkali-free glass "OA-10G" manufactured by Nippon Electric Glass, Co., Ltd.) and the film forming conditions of the transparent conductive film 3 were changed as described below.

Film Forming Conditions of Transparent Conductive Film 3

Film material: IZO
Film forming temperature (temperature of film forming portion 2a1): −20° C.
Applied voltage during film formation: 1 kW
Rate of film formation: 0.1 m/min
Number of times of processing for film formation: once The thickness of the obtained transparent conductive film 3 was 100 nm and the sheet resistance thereof was 30 ohms per square. Regarding the evaluation for warpage, substantially no uplift was produced in a 100 mm square sheet and the warpage could be reduced to below 1 mm. As seen from the above, it was confirmed that the warpage could be reduced without decreasing the surface strength and breakage during handling was less likely to occur.

Furthermore, in Example 7, the glass sheets after the film formation were cut into 100 mm square pieces and a piece not subjected to a heat treatment and pieces subjected to different heat treatments were observed in terms of change in visual light transmittance. The respective conditions of the heat treatments were 150° C. for an hour (150° C.-treated) and 250° C. for an hour (250° C.-treated). Specifically, comparison was made among a non-heat-treated piece, a 150° C.-treated piece, and a 250° C.-treated piece in terms of the spectral transmittance curve in a range of 400 nm to 700 nm corresponding to the visible light wavelength range. The results are shown in FIG. 6. As shown in FIG. 6, no significant change due to the heat treatments was found in terms of visible light transmittance. In the measurement of spectral transmittance curves, a spectral transmittance meter (trade name: "UV-Visible Spectrophotometer V-570", manufactured by JASCO Corporation) was used.

Comparative Example 1

Transparent conductive film-attached glass sheets were obtained in the same manner as in Example 1 except that the film forming conditions of the transparent conductive film were changed as described below.

Film Forming Conditions of Transparent Conductive Film

Film material: ITO
Film forming temperature (temperature of film forming portion 2a1): 250° C.
Applied voltage during film formation: 3 kW
Rate of film formation: 0.3 m/min
Number of times of processing for film formation: once The thickness of the obtained transparent conductive film 3 was 125 nm and the film was partly crystallized since it was formed at 250° C. higher than the crystallization temperature of ITO of approximately 170° C. For complete crystallization, the film was subjected to a heat treatment at 250° C. for 30 minutes in a clean oven, thus obtaining a film having a sheet resistance of 15 ohms per square. Regarding the evaluation for warpage, a 6 mm uplift was produced in a 100 mm square sheet. Because the warpage was large and the surface strength was significantly low, breakage during handling was likely to occur and the glass sheets were difficult to handle even in the form of a flat sheet.

Surface Strength Comparison Test

A glass sheet with an ITO film (uncrystallized) formed at −20° C. in Example 1, a glass sheet with an IZO film formed at −20° C. in Example 4, and a glass sheet with an ITO film (crystallized) formed at 250° C. in Comparative Example 1 were compared in terms of surface strength. The surface strength was evaluated by a ring-on-clamped-ring test. In the ring-on-clamped-ring test, as shown in FIG. 7, a transparent conductive film-attached glass sheet sample 1a obtained by cutting each of the above glass sheets to a size of 50 mm×50 mm was clamped between an upper disk 62 made of resin and a lower disk 63 made of metal. Then, with the transparent conductive film-attached glass sheet sample 1a clamped between the upper disk 62 (through hole inside diameter: 25 mm) and the lower disk 63 (through hole inside diameter: 25 mm), it was subjected to the test by pressing an upper ring 61 (diameter: 12.5 mm) against the sample 1a at a rate of 0.5 mm/min. The lower disk 63 also served as a lower ring. The transparent conductive film-attached glass sheet sample 1a was placed with its film side facing the lower disk 63. In the surface strength test, comparison was made among the samples with 100 representing the average breaking load of an unprocessed glass not subjected to the film formation. The results are shown in FIG. 8. As shown in FIG. 8, the sample with an amorphous film (ITO film formed thereon) in Example 1 and the sample with an amorphous film (IZO film formed thereon) in Example 4 had strength of approximately 80% relative to the strength of the unprocessed glass, whereas the sample with an ITO film crystallized in Comparative Example 1 was significantly reduced in strength to approximately 30% of the strength of the unprocessed glass.

REFERENCE SIGNS LIST

1 . . . transparent conductive film-attached glass sheet
1a . . . transparent conductive film-attached glass sheet sample
2 . . . glass sheet
2a . . . first principal surface
2a1 . . . film forming portion
2b . . . second principal surface
3 . . . transparent conductive film
10 . . . transparent conductive film-attached glass roll
10a, 21a . . . roll core
10b, 21b . . . protective film
20 . . . film forming apparatus
21 . . . glass roll
22 . . . sputtering source
23 . . . cooling roller
23a . . . roller body
23a1 . . . shaft
23b . . . pipe line
24 . . . vacuum chamber
30 . . . conveyer
40 . . . cutter
50 . . . flat plate
61 . . . upper ring
62 . . . upper disk
63 . . . lower disk

The invention claimed is:
1. A transparent conductive film-attached glass roll comprising:

a transparent conductive film-attached glass sheet taken up into a roll, the transparent conductive film-attached glass sheet including:
- a glass sheet; and
- an amorphous transparent conductive film provided on a principal surface of the glass sheet; wherein the glass sheet has a thickness of not less than 10 µm and not more than 200 µm;

the transparent conductive film is made of indium zinc oxide; and when the transparent conductive film-attached glass sheet is cut into 100 mm square pieces to obtain a transparent conductive film-attached glass sheet sample, and the transparent conductive film-attached glass sheet sample is put on a flat plate, and respective distances x1 to x4 from four ends of the transparent conductive film-attached glass sheet sample to the flat plate are measured, an amount of warpage corresponding to an average of distances x1 to x4 ((x1+x2+x3+x4)/4) is less than 1 mm.

2. The transparent conductive film-attached glass roll according to claim 1, wherein the transparent conductive film has a thickness of not less than 30 nm and not more than 500 nm.

3. The transparent conductive film-attached glass roll according to claim 1, wherein the transparent conductive film-attached glass roll includes the transparent conductive film-attached glass sheet together with a protective film, and the protective film is made of polyethylene terephthalate.

\* \* \* \* \*